US005444784A

United States Patent [19]

Toyama

[11] Patent Number: 5,444,784

[45] Date of Patent: Aug. 22, 1995

[54] ACOUSTIC SIGNAL PROCESSING UNIT

[75] Inventor: Soichi Toyama, Tokyo, Japan

[73] Assignee: Pioneer Electronic Corporation, Tokyo, Japan

[21] Appl. No.: 64,804

[22] Filed: May 21, 1993

[30] Foreign Application Priority Data

May 26, 1992 [JP] Japan .................................. 4-133501
Aug. 4, 1992 [JP] Japan .................................. 4-207975

[51] Int. Cl.⁶ .................................................. H03G 3/00
[52] U.S. Cl. .......................................... 381/61; 381/63; 84/707; 84/630; 84/DIG. 26
[58] Field of Search ..................... 381/61, 63, 94, 103, 381/86; 84/707, 630, DIG. 26

[56] References Cited

U.S. PATENT DOCUMENTS 4,005,268 1/1977 Canell et al. .......................... 84/707

*Primary Examiner*—Curtis Kuntz
*Assistant Examiner*—Sinh Tran
*Attorney, Agent, or Firm*—Sughrue, Mion, Zinn, Macpeak & Seas

[57] ABSTRACT

A sound echo machine as an acoustic signal processing unit of the present invention comprising an adder to which an input signal is fed, and a delay circuit for delaying the signal fed from the adder for a certain time to repeatedly feed back to the adder to generate an echo sound further comprises an input signal level detector for detecting the level of the input signal and sending it to a frequency oscillator to vary the oscillating frequency in accordance with the thus detected signal level for feeding it later to the delay circuit so as to modulate the time to be delayed at a predetermined cycle, whereby it can create an acoustic field in which a listener can feel as if various level of reflected sounds are coming towards him from various directions. On the other hand, a sound effecter as an acoustic signal processing unit comprising a plurality of acoustic signal processing sections, a plurality of attenuators each connected to these acoustic signal processing sections, and an adder for summing up all the signals from these attenuators further comprises a signal mixing ratio control section for monitoring the input acoustic signal level, and determining a signal mixing ratio among the respective output signals from the plurality of acoustic signal processing sections in accordance with the thus monitored level of the input acoustic signal, whereby even a simple structure can provide a specific sound effect.

2 Claims, 3 Drawing Sheets

ACOUSTIC SIGNAL PROCESSING UNIT

BACKGROUND OF THE INVENTION

1. Field of the Invention

The present invention generally relates to an acoustic signal processing unit for use with a sound equipment such as a Karaoke device which is an apparatus that radiates through a loudspeaker a piece of music as an accompaniment for a song reproduced from a recording medium and the singer's vocal when the singer sings toward a microphone to the accompaniment, an audio reverberation effecting device and so on, and more particularly to an acoustic signal processing unit such as a sound echo machine which is capable of generating a sound field similar to that of an auditorium such as a concert hall or the like, and also a new type of sound effecter which is capable of generating a unique sound effect that could not be obtained by a conventional sound effecter.

2. Description of the Prior Art

Hitherto, various sound echo machines have been provided as an acoustic signal processing unit, wherein an acoustic signal is repetitively fed back each time with a delay of 50 msec for generating a variety of tone qualities. FIG. 4 is a block diagram showing one example of a conventionally used sound echo machine, wherein reference numeral 1 denotes an input terminal, numeral 2 denotes an output terminal, 3 denotes an adder, 4 a delay circuit and numeral 5 denotes an attenuator.

With this construction above, an acoustic signal input through the input terminal 1 is output by way of the adder 3, wherein a part of the input signal is also fed to the attenuator 5 by way of the delay circuit 4 and the signal thus attenuated therein is further fed to the adder 3. The waveform of the signal output from this sound echo machine becomes an echo sound having a simple waveform repeated with a delay time t as shown in FIG. 5. In the figure, P0 is a basic waveform, and P1, P2 . . . are all fed back sounds each corresponding to a reflected sound.

On the other hand, in a conventional sound effecter also used as one of the acoustic signal processing units, it has been common to obtain a desired sound effect by use of only one acoustic signal processing section, and thus what is obtained thereby is only one type of sound effect. In order to solve this, there has also been provided a rather expensive sound effecter wherein a plurality of acoustic signal processing circuits each conducting different signal processing are connected either in series or in parallel, so that a plurality of different processing are conducted with respect to the input acoustic signal.

In recent years, there has been a demand for a sound echo machine as an acoustic signal processing unit used in a sound equipment such as the Karaoke device, which is capable of generating a sound field similar to that of a concert hall or the like, or specific sound effects corresponding to various types of music.

However, in the conventional echo machine having a delay circuit as shown in FIG. 4, an output waveform is determined simply by a delay time t generated at the delay circuit 4 and a single attenuation level at the attenuator 5 as is obvious by FIG. 5. In other words, the sound echo machine constructed as shown in FIG. 4 can not generate a substantial sound field as described above, but can produce only a simple echo sound without a variation of sound tone, and due to this fact, a sound echo machine capable of generating a further variation of fed back sounds and tone quality has been strongly desired.

In addition to this fact, in a sound effecter being used conventionally, a plurality of acoustic signal processing circuits are connected to conduct a plurality of sound processings, and the signal finally output thereby is only a total sum of a plurality of differently processed acoustic signal, which has not been sufficient for generating a satisfactory sound effect. Besides, in accordance with an improvement in technology of digital sound, a Digital Signal Processor (hereinafter referred to only as "DSP") has gradually been adopted in various sound equipments, so that by adopting this DSP for the above acoustic signal processing section, various sound effects can be provided by a program from external devices. However, there has still been a limitation to the sound effect due to the limitation of hardware or the processing speed thereof.

SUMMARY OF THE INVENTION

The present invention has been made to eliminate such problems as described, and it is an object of the present invention to provide an acoustic signal processing unit such as a sound echo machine, wherein the sound echo machine is capable of providing a variation to the sound field and sound tone qualities, and a sound effecter which is of a rather simple construction and yet capable of generating a variety of sound effects which was not possibly obtained by the conventional sound effecters.

In order to achieve the above object, a sound echo machine as an acoustic signal processing unit according to the present invention is constructed such that it comprises an adder to which an input signal is fed, and a delay circuit for delaying the signal fed from the adder, wherein the signal delayed for a certain time at the delay circuit is repeatedly fed back to the adder to generate an echo sound, and is characterized in that it further comprises an input signal level detector for detecting the level of the input signal, and a frequency oscillator that varies the oscillating frequency in accordance with the thus detected signal level fed from the input signal level detector and feeds it to the delay circuit to modulate the time to be delayed at a predetermined cycle.

In the sound echo machine as constructed above, when the output signal is fed back by way of the delay circuit, the delay time is modulated in accordance with the level of the input signal, whereby it can create an acoustic field in which a listener can feel as if various level of reflected sounds are coming towards him from various directions, and in addition, the tone quality also can be varied by changing the characteristic of the filter through which the input signal is fed back, so that a profound sound echo effect similar to that of a concert hall can be created.

On the other hand, a sound effecter as an acoustic signal processing unit according to the present invention is constructed such that it comprises a plurality of acoustic signal processing sections, each of which is connected in parallel with respect to an input acoustic signal to conduct a predetermined signal processing to the input signal, a plurality of attenuators respectively connected to each of the plurality of acoustic signal processing sections to adjust the level of the signal fed therefrom, an adder for summing up all the output signals fed from the plurality of attenuators, and is characterized in that it further comprises a signal mixing ratio control section that monitors the level of the input acoustic signal, determines a signal mixing ratio among the respective output signals from the plurality of acoustic signal processing sections in accordance with the thus monitored level of the input acoustic signal, and variably controls the attenuation level of the plurality of signal processing sections on the basis of the thus determined signal mixing ratio.

Furthermore, in the above sound effecter, an input acoustic signal is independently processed in each of the plurality of acoustic signal processing sections in accordance with respectively predetermined processing such as reverberation, echo, chorus, distortion, filtering and so on. Then after the above each signal processing is conducted, the acoustic signal is sent to the respective attenuators to be attenuated therein to the signal level determined in accordance with the signal ratio obtained by the signal mixing ratio control section, and thereafter each attenuated signal is summed up at the adder so as to be a finally output acoustic signal.

With the construction above, the signal mixing ratio control section 6 monitors the level of the input acoustic signal and variably controls the level to be attenuated at each of the attenuator in accordance with the thus monitored input Signal level. Accordingly, the acoustic signal finally output from the adder varies the signal mixing ratio thereof in real time in accordance with the variation of the level of the input acoustic signal, whereby a specific sound effect can be created that has not been possible before.

Other objects and features of the invention will be more fully understood from the following detailed description and appended claims when taken with the accompanying drawings.

DETAILED DESCRIPTION OF THE PREFERRED EMBODIMENTS

Figure 5:
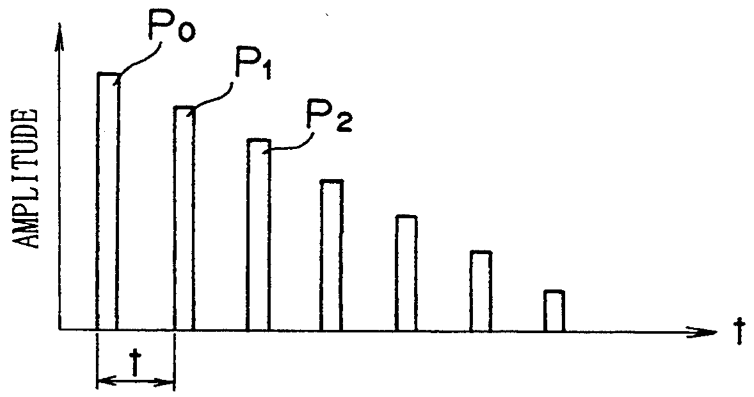
FIG. 5 PRIOR ART
FIG. 5 is an illustration representing a waveform of the embodiment of FIG. 4.
Figure 6:
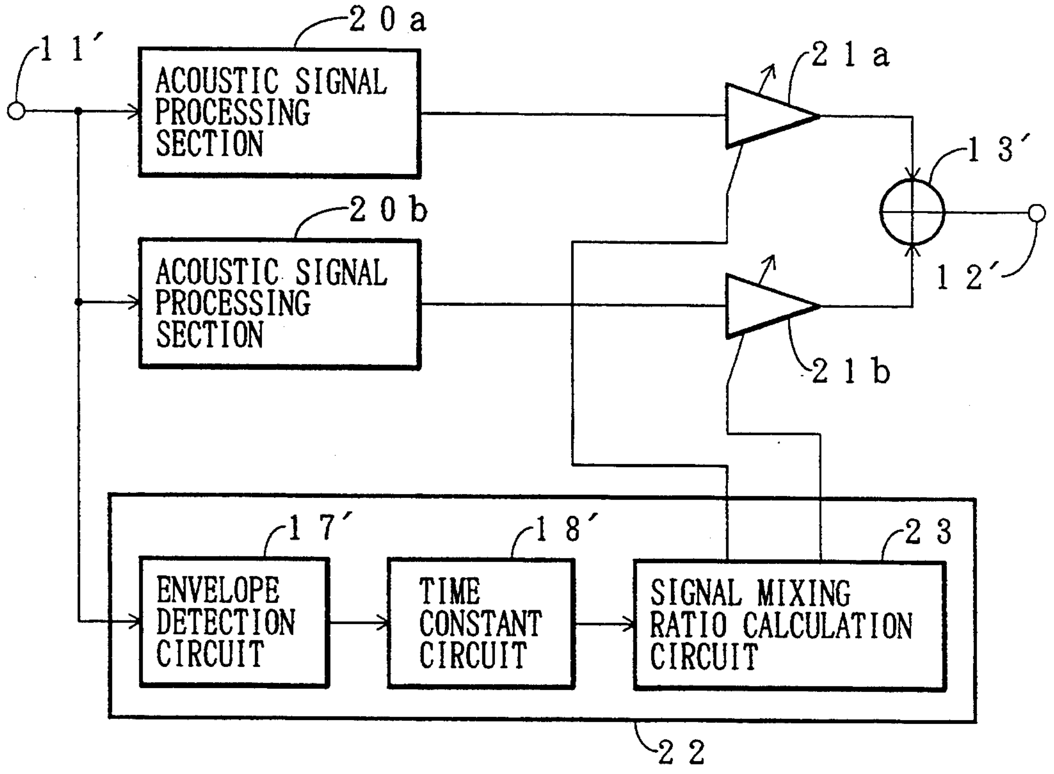
FIG. 6 is a block diagram showing one embodiment of a sound effecter representing an acoustic signal processing unit according to the present invention.

In the following, a sound echo machine and a sound effecter of the present invention are described with reference to the accompanying drawings, wherein from FIG. 1 to 5 the sound echo machine is described, whereas the sound effecter is shown in FIG. 6.

Figure 1:
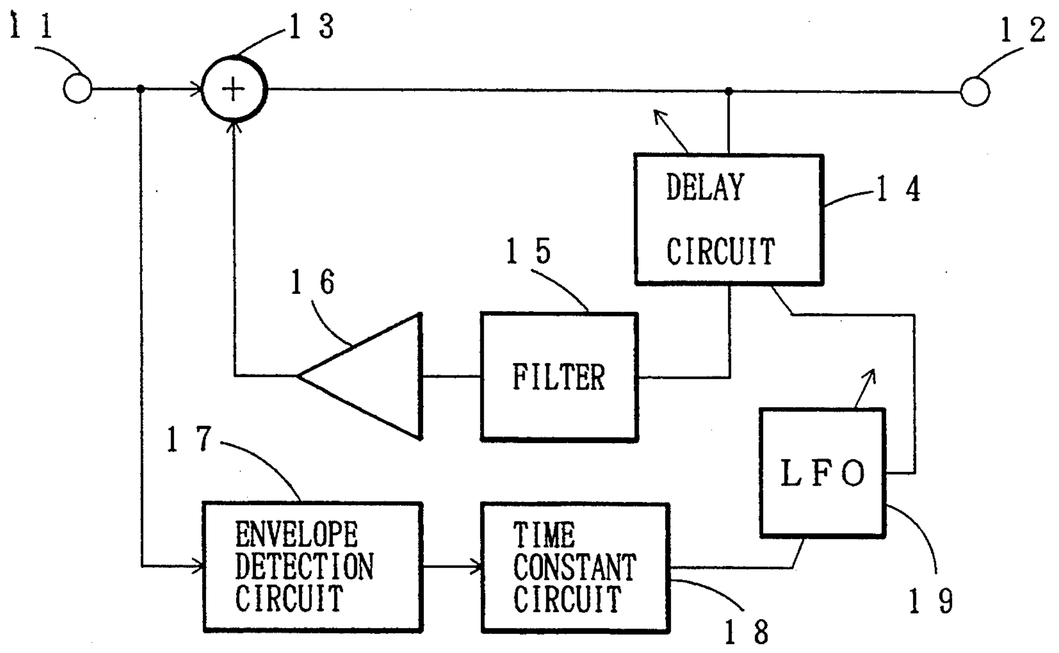
FIG. 1 is a circuit diagram showing one embodiment of the sound echo machine representing an acoustic signal processing unit according to the present invention.

Referring to FIG. 1, reference numeral 11 denotes an input terminal thorough which an acoustic signal is input, numeral 12 denotes an output terminal, 13 denotes an adder which is connected between the input terminal 11 and the output terminal 12, and adds up the signals fed back to the input signal, 14 denotes a variable type delay circuit to which an output signal from the adder 13 is provided, 15 denotes a filter to which a signal from the delay circuit 14 is fed, 16 denotes an attenuator for attenuating the signal passed through the filter 15, 17 denotes an envelope detection circuit for detecting the input signal fed from the input terminal 11, 18 denotes a time constant circuit for setting an attack time and a recovery time according to the leading and trailing waveforms of the output signal from the envelope detection circuit 17, and reference numeral 19 denotes a Low Frequency Oscillator (hereinafter referred to just as "LFO") which is composed of a voltage control oscillator (VCO), whose oscillating cycle can be controlled variably from several 10 msec to several seconds.

In the following, an operation of the echo machine of the present invention is explained. While an acoustic signal is fed from the input terminal 11 and outputted from the output terminal 12 by way of the adder 13, the input signal is also fed to the filter 15 by way of the delay circuit 14. Thereafter, the signal passed through the filter 15 is fed to the adder 13 through the attenuator 16 to be fed back to the signal input side. The delay time settled at the delay circuit 14 is modulated at a predetermined cycle by the oscillating frequency from the LFO 19, and varies in the range between several 10 msec to several seconds.

On the other hand, the signal input through the input terminal is simultaneously fed to the envelope detection circuit 17, and thereafter further sent to the time constant circuit 18, wherein an attack time and a recovery time are settled by the time constant circuit 18 in accordance with the leading and trailing waveforms of the input signal fed from the envelope detecting circuit 17. The signal which is fed to the time constant circuit 18 and varied at a predetermined time constant therein is further fed to the control terminal (not shown) of the LFO 19 so as to vary the oscillating frequency thereof. Then the oscillation output of the LFO 19 is fed to the delay circuit 14, wherein the modulation cycle given to the delay time is modulated in accordance with the level of the input signal. For example, in the case that the attack time is set shorter and the recovery time is set longer, when the input signal level abruptly becomes large, the voltage applied to the control terminal of the LFO 19 also abruptly rises, so that the oscillation cycle varies on the moment and accordingly the delay time of the delay circuit 14 also varies instantly. Thereafter, since the voltage applied to the control terminal of the LFO 19 gradually lowers and the oscillation cycle of the LFO 19 gradually changes, the oscillating frequency at the delay circuit 14 modulated by the oscillating frequency of the LFO 19 also gradually changes. Further, by changing the time constant of the time constant circuit 18, the attack time and recovery time can be settled to various level, and therefore the echo sound can also be variably changed. Still further, by selecting the filter 15 from the group of Low pass Filter (LPF), High Pass Filter (HPF), Band Pass Filter (BPS), Shelving Filter and so on, the sound tone of the fed back signal can also be desirably obtained. It is a matter of fact that if the above those filters are composed by a DSP, the fed back tone can be variably changed in real time.

Figure 3:
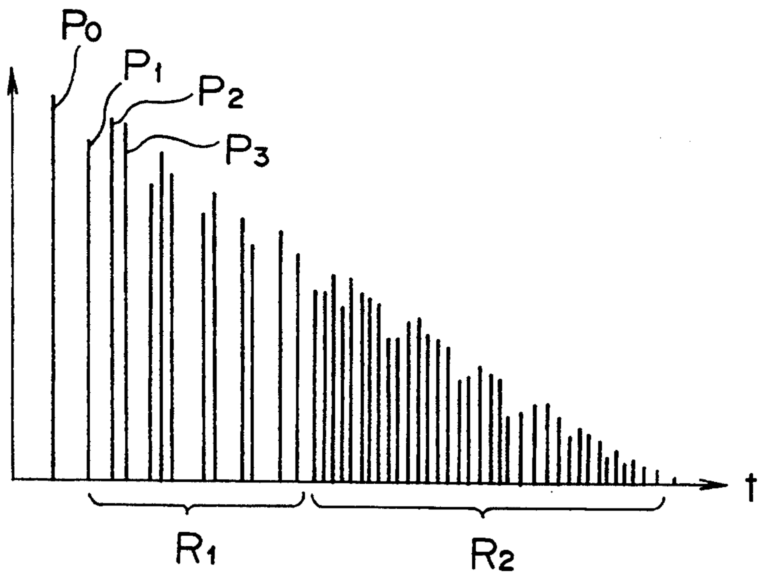
FIG. 3 is an illustration representing a waveform of the embodiment of FIG. 1.
Figure 4:
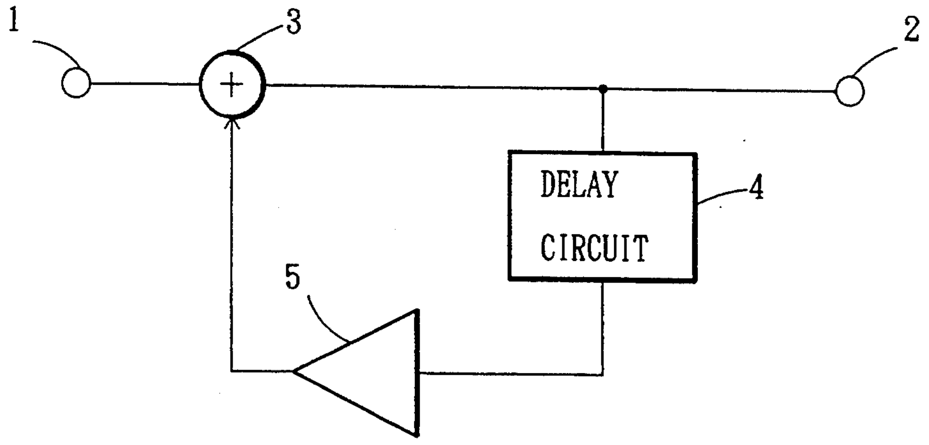
FIG. 4 PRIOR ART
FIG. 4 is circuit diagram showing one example of a conventional type sound echo machine.

As explained above, since the sound echo machine as one embodiment of the present invention is capable of modulating the delay time in accordance with the level of the input signal, various delay time can be generated as shown in FIG. 3 instead of the monotonous simple echo sound created by a simple repetition of the delayed signals as shown in FIG. 5, whereby the listener can feel as if various reflective sounds were coming toward him from various directions as in a sound field of a concert hall.

By the way, in order to create the echo sound of a concert hall it is necessary to generate a sound field in which the listener can feel as if various level of reflected sounds were coming toward him from various directions, and in order to complete this, the delay time of the delay circuit 14 should be modulated and by this operation, various different delay times are given to the basic wave P0, whereby the initial reflection sound R1 in the range between 50 msec and 100 msec is first created, and thereafter the false reverberated sound R2 is also generated as shown in FIG. 3. Thus, by giving a repetitive delay to the basic wave P0, an expansive and profound sound effect is first obtained by the initial reflection sound R1, and by the reverberated sound R2, a specific sound effect can be obtained in which a listener can feel as if the music sound was repetitively reflected on the wall or the floor, and then finally absorbed and disappeared.

Figure 2:
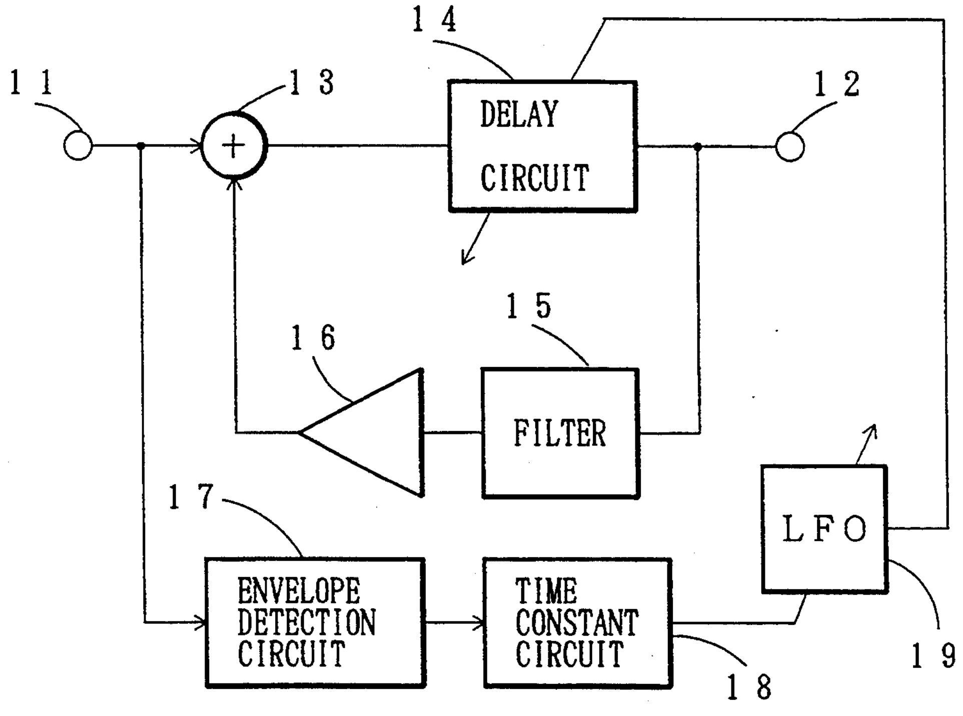
FIG. 2 is a circuit diagram showing another embodiment of the sound echo machine representing an acoustic signal processing unit according to the present invention.

FIG. 2 is a block diagram showing another embodiment of the echo machine of the present invention. In the figure, the variable type delay circuit 14 is connected between the adder 13 and the output terminal 12, and the oscillation output from the LFO 19 is fed to the variable delay circuit 14, which is different from FIG. 1, wherein since other parts apart from this structure is exactly the same as those in FIG. 1, an explanation regarding the exact structure thereof is omitted. The basic operation of the sound echo machine of FIG. 2 is same as FIG. 1, although the basic wave thereof is already delayed to be output.

It is also possible to construct the filter 15 by a DSP as a matter of fact. Further, it goes without saying that although in the embodiments shown in FIG. 1 and FIG. 2, an envelope detection circuit 17 is used as the level detection circuit of the input signal, it is not limited as such, and it can be constructed by a full-wave rectification circuit as well. In the following, there is shown an sound effecter as one embodiment of the present invention principally with reference to FIG. 6 that is a block diagram of the sound effecter. In the same figure, reference numeral 11' and 12' are respectively an input terminal and output terminal, reference numerals **20*a* and 20*b* respectively denote acoustic signal processing sections each conducting a predetermined signal processing (such as reverberation, echo, chorus, distortion, filtering and so on) to the signal inputted thereto, numerals 21*a* and 21*b* denote respectively a variable type attenuators each composed of a voltage control amplifier (VCA) or the like, and numeral 13' denotes an adder. Reference numeral 22 denotes a signal mixing ratio control section which is a circuit for monitoring the level of the input acoustic signal, determining a signal mixing ratio among the respective output signals from the plurality of acoustic signal processing sections in accordance with the thus monitored level of the input acoustic signal, and variably controlling the attenuation level of the plurality of signal processing sections on the basis of the thus determined signal mixing ratio. In an example shown in FIG. 6, the above signal level distribution ratio control section 22 is composed of an envelope detection circuit 17' for detecting an acoustic signal to obtain the envelope thereof, a time constant circuit 18' for settling the attack time and recovery time of the input acoustic signal referring to the leading wave and the trailing wave of the thus obtained envelope, and of a signal mixing ratio calculation circuit 23 for calculating a signal mixing ratio in accordance with the attack time and recovery time of the input acoustic signal, and variably controlling the attenuation level to be settled at the attenuators 21*a* and 21*b***.

In the following, the operation of the above sound effecter is explained.

An acoustic signal input through the input terminal 11' is fed to the acoustic signal processing sections **20*a* and 2O*b*, at which a pair of predetermined signal processings such as the reverberation and echo, chorus and distortion, high pass filtering (HPF) and low pass filtering (LPF) and so on are applied to the input signal, and the thus processed signals are sent respectively to the attenuators 21*a* and 21*b***.

On the other hand, the acoustic signal input through the input terminal 11' is fed also to the envelope detection circuit 17' of the signal mixing ratio control section 23. The envelope detection circuit 17' outputs the envelope thereof by detecting the input acoustic signal, and sends it to the time constant circuit 18'. The time constant circuit 18' settles the attack time and recovery time referring to the leading and trailing waves of the envelope fed from the envelope detection circuit 17', and then sends them to the signal mixing ratio calculation circuit 23. The calculation circuit 23 calculates a signal mixing ratio based on the thus settled attack time and recovery time, and variably controls and determines the attenuation level at the attenuators **21*a* and 21*b*** on the basis of the signal mixing ratio.

For example, if the attenuation level of the attenuator **21*a* is set to $\alpha$ %, the attenuation level of the attenuator 21*b* is set to $(100-\alpha)$% or while the attenuation level of the attenuator 21*a* is set and kept to 0, that of the attenuator 21*b*** only is set to $\alpha$ % and so on.

The signal output from the attenuators **21*a* and 21*b* are added to each other at the adder 13', so that the finally summed up acoustic signal is output through the output terminal 12'. In this case, the acoustic signal output from the adder 13' is a combination of signals attenuated in each of the attenuators in accordance with the signal mixing ratio which is settled by the signal mixing ratio calculation circuit 23** based on the level of the input acoustic signal, and therefore, a specific sound effect can be processed by this construction, which is completely different from a conventional method wherein two input signals are simply added to each other.

For example, in the case that the leading wave is abrupt in which an input acoustic signal becomes high in a moment, the attack time becomes thereby short, and thus the attenuation level $\alpha$ % is set to a small amount in proportion to the attack time. As a result, the attenuation level $\alpha$ % of the attenuator **21*a* becomes smaller than the attenuation level $(100-\alpha)$% of the attenuator 21*b*, whereby within the above signal to be finally output from the adder 13', the acoustic signal output from the acoustic signal processing section 20*a* is contained more than that from the acoustic signal processing section 20*b***.

On the other hand, in the case that the input acoustic signal is such that the trailing wave thereof is slow and accordingly the recovery time becomes long, the attenuation level $\alpha$ % is also set to a large amount in proportion to recovery time. As a result, the attenuation level $\alpha$ % of the attenuator 21*a* becomes, on the contrary, larger than the attenuation level $(100-\alpha)\%$ of the attenuator 21*b*, whereby within the acoustic signal to be finally output from the adder 13', the acoustic signal fed from the processing section 20*b* is contained more than that from the acoustic signal processing section 20*a*.

It is to be noted that either one of the acoustic signal processing sections 20*a* and 20*b* can be fed to the corresponding attenuator without processing it. Also, it can be arranged such that the same kind of signal process (for example the reverberation only) is conducted in the both acoustic signal processing sections 20*a* and 20*b*, wherein only a processing parameter thereof is different from each other.

Still further, in the above embodiment, only the case that only two acoustic signal processing sections 20*a* and 20*b* are provided is explained to avoid complexity, it is a matter of fact that three or more than three sections can be provided.

Besides, these two acoustic signal processing sections 20*a* and 20*b* can be constructed by DSPs, wherein the target of process can be variably changed from outside on requirements.

[Effect of the Invention]

As described above, an echo machine as one embodiment of the present invention is constructed such that the delay time of the delay circuit is modulated in accordance with the level of the input signal so as to vary the modulation cycle thereof, whereby it enables the listener to feel as if various level of reflected sounds were coming towards him from various directions, and in addition to this, the sound tone quality can also be varied by changing the characteristic of the filter. Thus, the sound echo machine as constructed above can create a specific sound field such as that of a concert hall within a sound equipment such as a Karaoke device.

Further, the echo machine as one embodiment of the present invention can also change the sound tone quality of the fed back sound in real time by adopting a DSP as its filter, and has also another advantage to create various sound effects in accordance with the type of music sound.

In addition, as obvious from the above description, a sound effecter as another embodiment of the present invention is constructed such that the signal mixing ratio of the acoustic signal varies in accordance with the level of the input signal and thus the tone of the finally summed up output signal delicately varies based on the level of the input acoustic signal, and accordingly, even a simple structure can provide a specific sound effect which was not possible with a conventional sound effecter.

Having now fully described the invention, it will be apparent to one of ordinary skill in the art that many changes and modifications can be made thereto without departing from the spirit and scope of the invention as set forth herein.

What is claimed is:

1. An acoustic signal processing unit including a sound echo machine, said sound echo machine comprising:

an input terminal for receiving an acoustic signal, an adder for adding said acoustic signal and a feedback signal to generate an output signal, a delay circuit for delaying the output signal of said adder for a certain time, and an attenuator for attenuating the signal fed from said delay circuit through a filter and feeding back said attenuated signal to said adder as said feedback signal, wherein said sound echo machine further comprises;

an input signal level detector for detecting the level of the signal fed through the input terminal, and a local frequency oscillator for varying the oscillating frequency in accordance with the detected signal level fed from said input signal level detector and feeding the varied frequency to said delay circuit to modulate the time to be delayed at a predetermined cycle wherein the output signal of said adder is also the output of said sound echo machine.

2. An acoustic signal processing unit as claimed in claim 1, wherein said input signal level detector in said sound echo machine further comprises;

an envelope detection circuit for detecting the input acoustic signal, and a time constant circuit for setting an attack time and a recovery time on the basis of the leading and trailing waveforms of the signal fed from said envelope detection circuit before feeding to said local frequency oscillator.

* * * * *